United States Patent
Magerl et al.

(10) Patent No.: US 10,379,142 B2
(45) Date of Patent: Aug. 13, 2019

(54) CIRCUIT ASSEMBLY HAVING A TRANSFORMER WITH CENTRE TAPPING AND MEASURING OF THE OUTPUT VOLTAGE

(71) Applicant: FRONIUS INTERNATIONAL GmbH, Pettenbach (AT)

(72) Inventors: Christian Magerl, Langschlag (AT); Franz Peter Musil, Steinerkirchen a. d. Traun (AT); Robert Eberl, Linz (AT); Friedrich Steinmaurer, Steinbach am Ziehberg (AT)

(73) Assignee: FRONIUS INTERNATIONAL GMBH, Pettenbach (AT)

( * ) Notice: Subject to any disclaimer, the term of this patent is extended or adjusted under 35 U.S.C. 154(b) by 0 days.

(21) Appl. No.: 15/556,916

(22) PCT Filed: Mar. 1, 2016

(86) PCT No.: PCT/EP2016/054325
§ 371 (c)(1),
(2) Date: Sep. 8, 2017

(87) PCT Pub. No.: WO2016/142217
PCT Pub. Date: Sep. 15, 2016

(65) Prior Publication Data
US 2018/0246145 A1    Aug. 30, 2018

(30) Foreign Application Priority Data

Mar. 9, 2015   (AT) .............................. A 50186/2015

(51) Int. Cl.
*G01R 15/00* (2006.01)
*H02M 3/335* (2006.01)
(Continued)

(52) U.S. Cl.
CPC .......... *G01R 15/005* (2013.01); *B23K 9/1043* (2013.01); *B23K 9/32* (2013.01);
(Continued)

(58) Field of Classification Search
CPC  G01R 15/005; G01R 19/0084; B23K 9/1043; B23K 9/32; H01F 27/29;
(Continued)

(56) References Cited

U.S. PATENT DOCUMENTS 3,362,900 A  *  1/1968  Sabins .................... C23F 13/04
                                                              204/196.03
4,164,016 A       8/1979  Schuchard
(Continued)

FOREIGN PATENT DOCUMENTS

CN         201 219 239          4/2009
CN          101895201          11/2010
(Continued)

OTHER PUBLICATIONS

Austria Search Report conducted in counterpart Austria Appln. No. 50186/2015 (dated Dec. 18, 2015).
(Continued)

*Primary Examiner* — Melissa J Koval
*Assistant Examiner* — Trung Nguyen
(74) *Attorney, Agent, or Firm* — Greenblum & Bernstein, P.L.C

(57) ABSTRACT

To enable in a circuit arrangement (8) with a transformer with center tap the voltage measurement on the secondary side simply and safely, it is provided that at least two series-connected resistors (R3, R4) are connected between the two outer connections (A1, A2) of the secondary side of the transformer (T) to form a measurement point (P) between the two resistors (R3, R4), and a voltage measurement unit (V) is provided to measure the voltage ($U_P$)
(Continued)

between the measurement point (P) and the second output pole (13), which corresponds to the output voltage ($U_A$).

9 Claims, 4 Drawing Sheets

(51) Int. Cl.
*H02M 7/155* (2006.01)
*B23K 9/10* (2006.01)
*B23K 9/32* (2006.01)
*G01R 19/00* (2006.01)
*H01F 27/29* (2006.01)
*H02M 7/06* (2006.01)
*H05K 1/18* (2006.01)

(52) U.S. Cl.
CPC ......... *G01R 19/0084* (2013.01); *H01F 27/29* (2013.01); *H02M 3/335* (2013.01); *H02M 7/06* (2013.01); *H02M 7/155* (2013.01); *H02M 7/1555* (2013.01); *H05K 1/181* (2013.01); *H05K 2201/10166* (2013.01); *H05K 2201/10174* (2013.01)

(58) Field of Classification Search
CPC .... H02M 3/335; H02M 7/155; H02M 7/1555; H05K 1/181; H05K 2201/10166; H05K 2201/10174
USPC ............. 324/726, 76.11, 600, 107, 120–127, 324/455–547, 87, 119; 361/93.5, 93.6, 361/836, 79, 86, 87
See application file for complete search history.

(56) References Cited

U.S. PATENT DOCUMENTS

| | | | |
|---|---|---|---|
| 5,406,051 A | | 4/1995 | Lai |
| 5,907,292 A | * | 5/1999 | Ahr .................. G08C 19/02 340/870.31 |
| 5,926,381 A | | 7/1999 | Moriguchi et al. |

FOREIGN PATENT DOCUMENTS

| | | |
|---|---|---|
| CN | 202940733 | 5/2013 |
| DE | 2849170 | 2/1980 |
| JP | 2003-319656 | 11/2003 |
| JP | 2009-106029 | 5/2009 |
| JP | 2010-130758 | 6/2010 |
| JP | 2011-062079 | 3/2011 |
| JP | 5240529 | 7/2013 |

OTHER PUBLICATIONS

Int'l Preliminary Report on Patentability (Form PCT/IPEA/409) in PCT/EP2016/054325) (dated Sep. 14, 2017).
Japan Office Action conducted in counterpart Japan Appln. No. 2017-547504 (dated Dec. 5, 2018).
China Office Action conducted in counterpart China Appln. No. 201680014460.7 (dated Jan. 25, 2019) (w/ English translation).

* cited by examiner

CIRCUIT ASSEMBLY HAVING A TRANSFORMER WITH CENTRE TAPPING AND MEASURING OF THE OUTPUT VOLTAGE

The present invention relates to a circuit arrangement with at least one transformer with center tap, wherein the center point of the secondary side of the transformer is connected to the first output pole via a first output line, and the two outer connections of the secondary side of the transformer are connected via one electrical circuit element each, and via a second output line to a second output pole, and with a voltage measurement for measuring the output voltage of the circuit arrangement that is applied between the first and second output poles, wherein at least two series-connected resistors are connected between the two outer connections of the secondary side of the transformer to create a measurement point between the two resistors.

Figure 1:
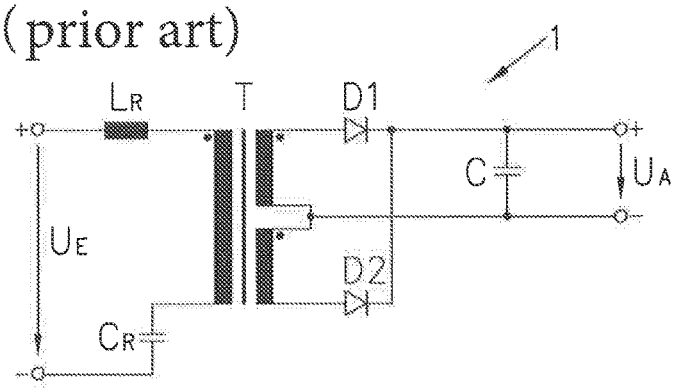

Current converters, such as, for example, DC converters, switching converters, resonant switching converters, etc. are often used on the secondary side in transformers with center tap. An example of the above is a current converter 1 in form of a known resonant converter, as shown in FIG. 1, where a choke $L_R$, capacitance $C_R$ and the primary side of the transformer T form a resonant circuit. A pulse pattern at the input $U_E$ excites the resonant converter to oscillate. The pulse pattern can be implemented, for example, by a known circuit arrangement and a PWM controller (not shown in FIG. 1). Said oscillation is transmitted via transformer T and rectified on the secondary side.

Figure 2:
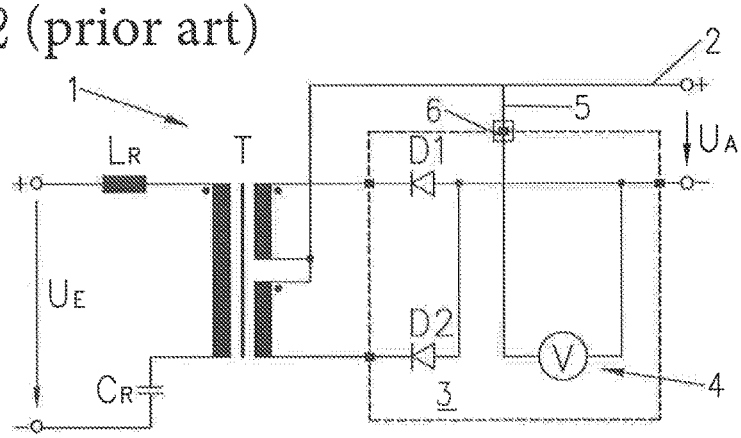

To control the output voltage $U_A$ of such current converters 1, it is typically necessary to measure the output voltage $U_A$. As encountered especially in the heavy-duty power classes, such as, for example, welding current sources, high currents flow on the secondary side. The circuit elements on the secondary side of the current converter 1 are usually disposed on a substrate 3, such as, for example, a circuit board (as shown in FIG. 2), or the like. However, the circuit elements can also be connected by means of copper stirrups (particularly for very high currents or voltages). To avoid having to route the live positive output line 2 of the current converter 1 via the substrate 3, which would require a large copper cross-section on the substrate 3, the positive output line 2 is typically routed to the exterior as a separate line, not via a substrate where the voltage measurement 4 for measuring the output voltage $U_A$ is implemented, as shown in FIG. 2. However, this means it is necessary for the positive output line 2 to be connected to the substrate 3 by means of an additional connecting line 5. To this end, a bush 6 is disposed on the circuit board 3 where the connecting line 5 is connected. However, the additional connecting line 5 and the necessity of providing a bush 6 on the substrate 3 naturally also increase the complexity of the electrical assembly. By analogy, the same applies when copper stirrups are used because, according to the prior art regarding the measuring of voltage, a connecting line 5 is required for measuring the voltage between the two output poles that connects the positive output line 2 to the voltage measurement unit.

Aside from the above, the connecting line 5 may become detached over time or the assembler may forget connecting the connecting line 5 with the substrate 3 or the positive output line 2 altogether. Both instances typically result in a failure of the controlled current converter 1 that needs a measured value of the output voltage $U_A$ for operating. Specifically, if the connecting line 5 is omitted, excess voltage at the diodes D1, D2 may result and destroy them.

Therefore, foregoing this additional connecting line 5, which is indeed an error source, is desirable.

U.S. Pat. No. 4,164,016 A shows a transformer with center tap where a measurement point has been created between the outer terminals of the secondary side by means of two resistors. A voltage is measured between the measurement point and the center tap, which means that a connecting line to the center tap is still necessary.

Although the problems of the prior art are described based on the concrete example of a current converter embodied as a resonant converter with transformer with center tap, the same generally applies for any circuit arrangement with a transformer with center tap which provides for measuring the output voltage on the secondary side. A transformer with center tap is also used, for example, in center point converters or synchronous converters.

It is therefore an object of the present invention to provide a circuit arrangement with a transformer with center tap that enables a simple and safe taking of voltage measurements of the output voltage on the secondary side without increasing the technical complexity of the circuit.

According to the invention, this object is achieved by providing a voltage measurement unit that measures the voltage between a measurement point and the second output pole which corresponds to the output voltage. The two series-connected resistors create a measurement point to which a voltage is applied opposite the second output pole that corresponds to the output voltage. This means that only the two resistors must be disposed to facilitate measuring a voltage that corresponds to the output voltage, and therefore also the output voltage, using simple means. A connecting line between the first output pole and the substrate and/or between the first output pole and the voltage measurement unit is therefore no longer necessary.

One advantageous configuration envisions disposing the electrical circuit elements and the two resistors on at least one substrate, particularly a circuit board. In that case, no preparations are needed on the substrate, such as, for example, in the way of providing a connecting bush, to connect the first output line with the substrate, thereby reducing the technical circuit complexity.

If at least one further resistor is connected between the measurement point and the second output pole, the voltage range of the voltage measurement unit at the input side can be reduced due to the resulting voltage divider. The voltage measurement unit can therefore advantageously be configured for a lower measurement voltage.

The circuit arrangement according to the invention is especially advantageous for use in a resonant converter with a resonant circuit, particularly as a welding power source, because measuring the output voltage therein is important for controlling the output voltage.

However, certain resonant converters, such as, for example, series-parallel resonant converters, have the characteristic that, due to the oscillator circuit formed with $C_P$, the output voltage $U_A$ (i.e., without any connected load) increases in the no-load state to such a degree that additional wiring 7 (FIG. 3) at the output side is advantageous for controlling the resonant converter. This is the case especially for sources of welding current, when maintaining a certain output voltage $U_A$ is desirable also in the no-load state. To this end, while in the no-load state, the resonant converter is operated in a pulsed fashion. Voltage pulses are applied for a specified time span at the input $U_E$ of the resonant converter. The oscillation generated by the resonant converter charges the capacitor C3 on the secondary side via diode D3. During the times when no voltage pulses are applied, the capacitor C3 discharges via the resistor R1. Correspondingly, a mean output voltage $U_A$ is generated at the output of the resonant converter that can be maintained at a desired level by means of adjusting the voltage pulses at the input. This additional wiring 7 has no impact during the normal operation of the resonant converter. Still, the capacitor C3 must nonetheless be configured for the maximum output voltage $U_A$ and a maximum pulse frequency, which is why it must have appropriately large dimensions requiring the corresponding amount of space on the substrate 3. However, naturally, this circuit also requires the connecting lines 5 for connecting the positive output line 2 with the substrate 3, where said additional wiring 7 is disposed. If the connecting line 5 is omitted, nonetheless, it must still be ensured that the output voltage $U_A$ can be controlled to the desired voltage level while the resonant converter is in the no-load state.

Therefore, it is a further object of the present invention to ensure, using the circuit arrangement according to the invention, that the output voltage can be controlled and/or adjusted to a desired value while the resonant converter is in the no-load state, and avoiding the above-captioned circuit-design problems, by means of a simple additional circuit.

According to the invention, this further object relative to the resonant converter is achieved in that one capacitor each is connected in parallel to the electrical circuit elements on the secondary side. During normal operation (i.e., with a connected load), the capacitors must therefore conduct current only for half a period, respectively, and can therefore be dimensioned much smaller in comparison to the prior art. Correspondingly, a possible substrate can also be configured smaller and, moreover, the connecting line between the first output pole and the substrate, needed until now, can be omitted.

Figure 3:
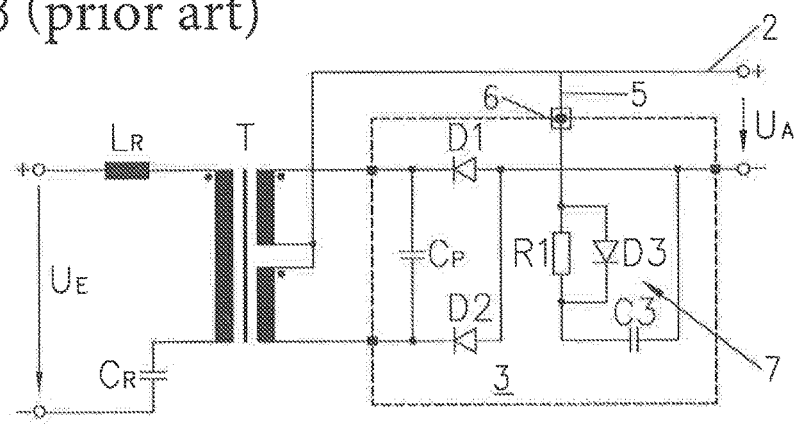
Figure 4:
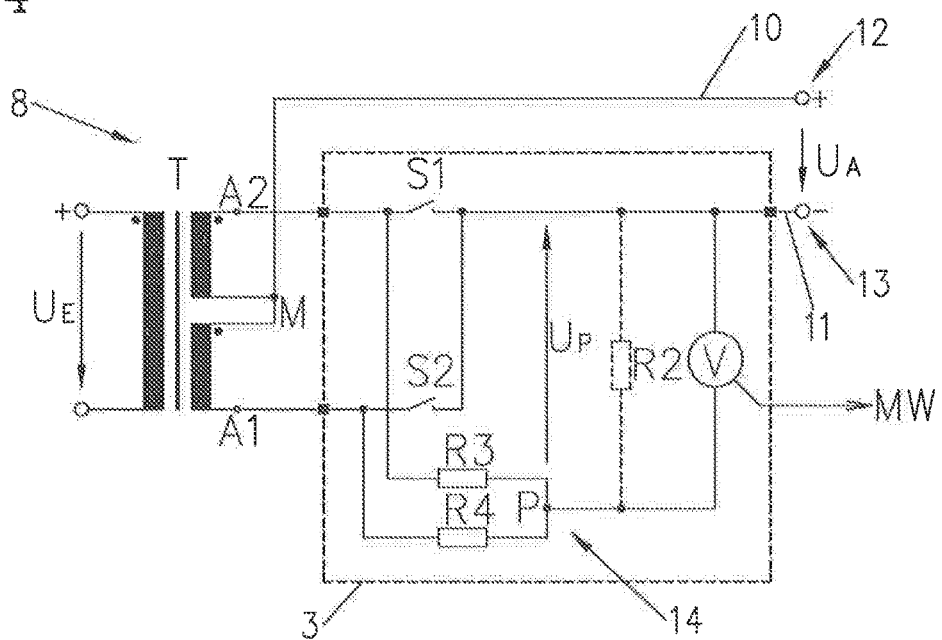
Figure 5:
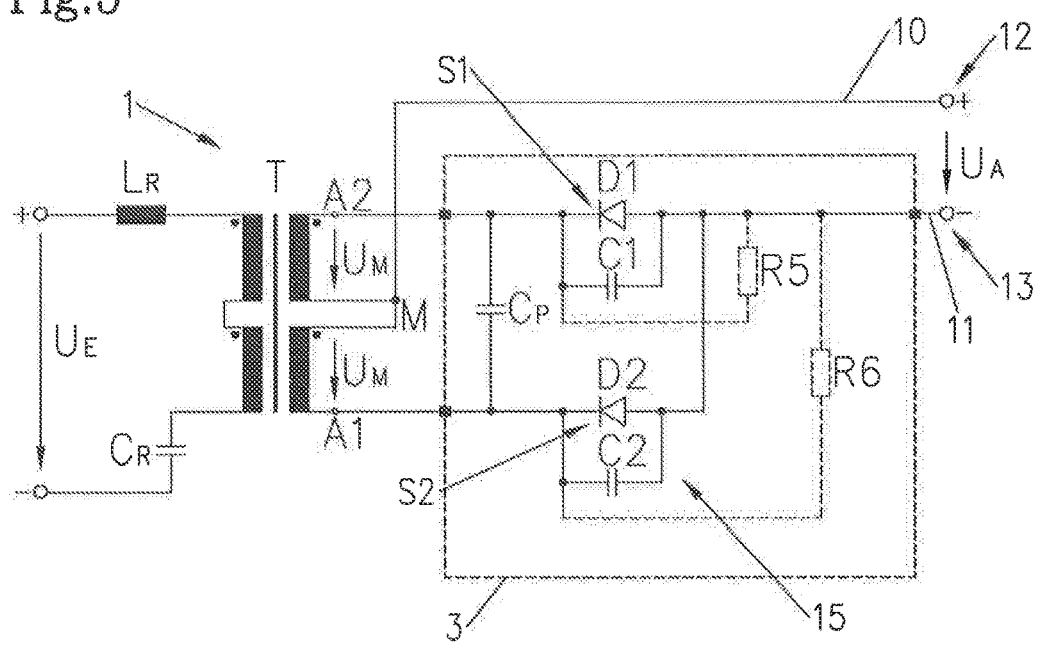
Figure 6:
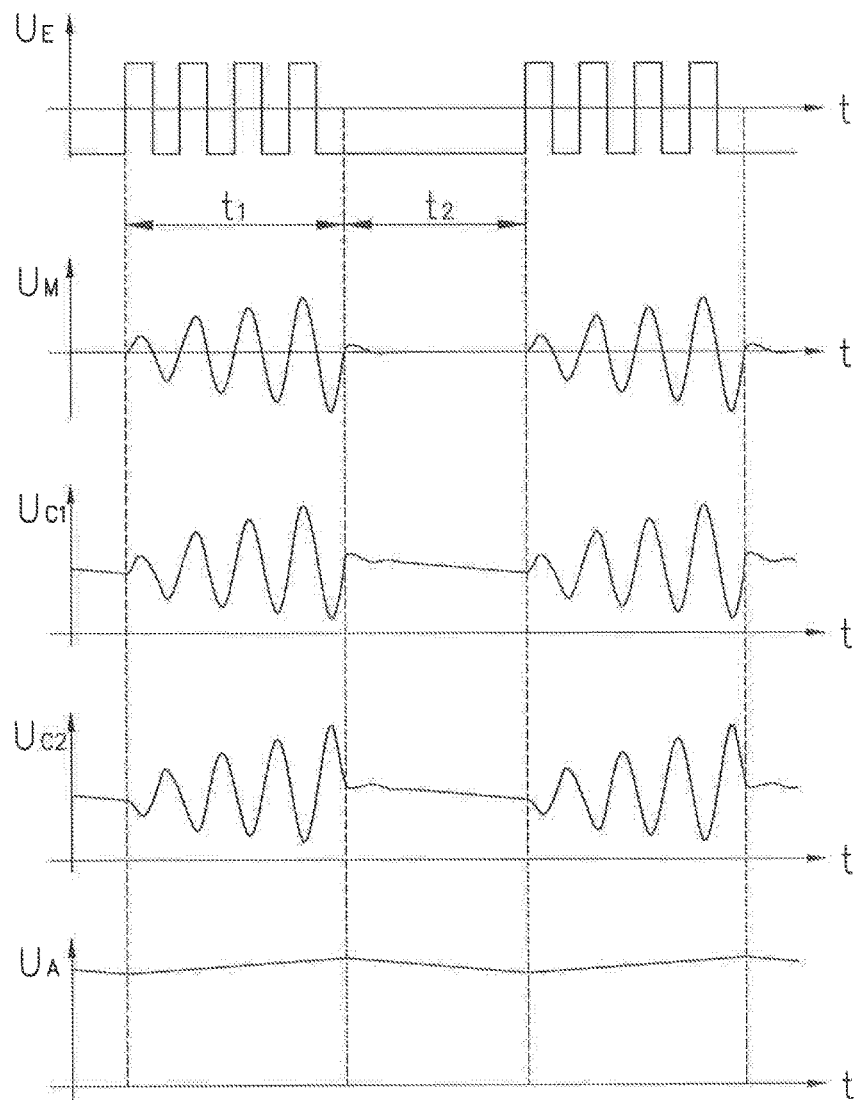
Figure 7:
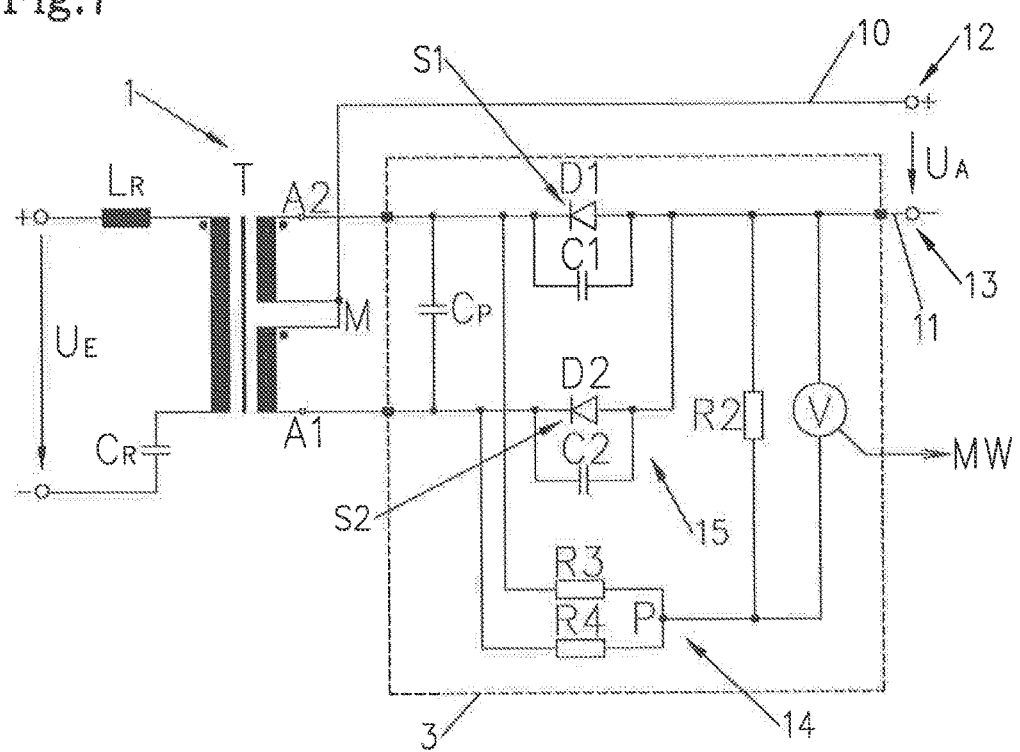

The present invention will be described in further detail below referring to FIGS. 1 to 7, which demonstrate advantageous embodiments of the invention that are exemplary and schematic in nature and not intended to limit the scope of the invention. Shown are:

FIG. 1, showing a typical resonant converter according to the prior art;

FIG. 2, showing a voltage measurement that is customary in the prior art taken at the secondary side of a transformer with center tap;

FIG. 3, showing the additional wiring customary in the prior art for controlling the output voltage of a series-parallel resonant converter in the no-load state;

FIG. 4, showing a circuit arrangement with a transformer with center tap and voltage measurement of the output voltage according to the invention;

FIG. 5, showing a series-parallel resonant converter with secondary wiring for adjusting the no-load voltage;

FIG. 6, showing the voltage curves resulting in the series-parallel resonant converter in the no-load state; and FIG. 7, showing a series-parallel resonant converter having the measurement apparatus according to the invention for measuring voltage and the secondary wiring for controlling the output voltage in the no-load state.

FIG. 4 shows a circuit arrangement 8 having a transformer T with center tap on the secondary side. The secondary side of the transformer T with center tap has at least three connections: one for the center point M and two at the ends of the windings on the secondary side, wherein these connections are designated as outer connection A1, A2.

But it is noted in general that a transformer with center tap within the meaning of the invention also includes the use of two or more transformer windings with a joint core, which have the windings on the secondary and primary sides each connected in series (see FIG. 5). Independent transformers with primary windings connected in parallel and secondary windings connected in series are also included. An electrical connection between two windings connected in series on the secondary side then corresponds to the center point M where the first output line 10 can be connected.

The center point M on the secondary side is routed to the outside via the first output line 10, here a positive output line, as a first output pole 12, here the positive pole. The first output line 10 therein is not routed via a substrate 3, as, for example, a circuit board, but directly as a line to the outside. The two outer, not series-connected, connections A1, A2 of the secondary side of the transformer 1 are each routed in a manner known in the art to a first connection of a circuit element S1, S2. The respectively second connections of the circuit elements S1, S2 are connected to each other and form the second output pole 13, here the negative pole, of the rectifier that is routed to the outside with a second output line 11, here a negative output line.

If passive circuit elements in the form of diodes are used as electrical circuit elements S1, S2, a known center point rectifier is obtained. If active circuit elements in the form of, for example, semiconductor switches, such as, e.g., MOSFETs, are used as electrical circuit elements S1, S2, a known synchronous rectifier is obtained. As the features of center point rectifiers and synchronous rectifiers are well known in the art and immaterial for purposes of the present invention, they will not be addressed in further detail.

The circuit elements S1, S2 are disposed on the substrate 3 as is customary in the art. Naturally, the substrate 3 can be configured as divided. Particularly in the case of active circuit elements S1, S2, the power part with the active circuit elements S1, S2 is often disposed on a separate substrate 3. In addition, an electric measurement apparatus 14 is additionally disposed on the substrate 3 for measuring the output voltage $U_A$. However, the circuit elements of the secondary side can also be connected to each other by means of copper stirrups. A combination circuit arrangement on the secondary side with a substrate 3 and copper stirrups is also conceivable. For example, the measurement apparatus 14 for measuring the output voltage $U_A$ could be disposed on a substrate 3, and the remainder of the circuit elements could be connected by means of copper stirrups.

Said measurement apparatus 14 for measuring the output voltage $U_A$ substantially has two resistors R3, R4 that are series-connected between the two outer connections A1, A2 of the secondary side of the transformer 1'. This way, a measurement point P is created between the two resistors R3, R4, which features a voltage $U_P$ opposite the second output pole 13 that corresponds to the output voltage $U_A$ applied to the center point M. Said measurement $U_P$ at the measurement point P can be measured by any voltage measurement unit V and provided as an analog or digital measured value MW. For example, the voltage measurement unit V can be configured as an amplifier circuit with an operational amplifier, wherein the output of the amplifier circuit is digitized in an analog-digital transformer and routed to the outside as the digital measured value MW.

If the two resistors R3, R4 are equal, the voltage $U_P$ at the measurement point P corresponds to the output voltage $U_A$ at the center point M, meaning, in the shown embodiment of the voltage, at the first output pole 12. If the resistors R3, R4 are not equal, a voltage that corresponds to the ratio of the resistors R3, R4 becomes manifest at the measurement point P. In both cases, it is thus possible to measure the output voltage $U_A$ at the measurement point P by measuring the voltage $U_P$ of the measurement point P opposite the second output pole 13, as hinted at in FIG. 4.

The voltage $U_P$ at measurement point P can be measured directly but a measurement by means of a voltage divider is also conceivable. This allows for the use of a voltage measurement unit V with a reduced input range, thereby achieving technical circuit simplifications. To this end, it is possible to create a voltage divider between the measurement point P and the second output pole 13 by means of an additional resistor R2, as hinted at in FIG. 4. The resistor R2 therein, in conjunction with the resistors R3 and R4, achieves a corresponding reduction of the voltage $U_P$ at the measurement point P that, however, is still proportionate relative to the output voltage $U_A$. If the voltage measurement unit V requires a still lesser input voltage, it is possible to distribute the resistor R2 at an appropriate ratio over two resistors to achieve an adjustment to the input voltage range of the voltage measurement unit V.

This means, when using a measurement apparatus 14 for the measurement of the voltage of the output voltage $U_A$, it follows, correspondingly, that routing the first output line 10 via the substrate 3 or connecting the first output line 10, as seen in the prior art, to the substrate 3 or the voltage measurement unit V via an additional connecting line 5 is no longer necessary.

FIG. 5 shows a current converter 1 in form of a series-parallel resonant converter with a series oscillator circuit on the primary side consisting of a choke $L_R$, vibrating capacitor $C_R$ and the primary side of the transformer T, a parallel oscillator circuit on the secondary side consisting of vibrating capacitor $C_P$ and the secondary side of the transformer T, and a center point rectifier (meaning with diodes D1, D2 as electrical circuit elements S1, S2) on the secondary side. The primary side is not completely displayed in the present figure; particularly, the electrical circuit for generating the shown input voltage $U_E$, which is known in the art, has been omitted. It is understood that the oscillator circuit on the primary side can also be configured as a parallel oscillator circuit, which is known in the art, where the vibrating capacitor $C_R$ is, for example, connected in parallel relative to the primary side of the transformer T. Similarly, the oscillator circuit can be configured differently or not at all on the secondary side, which is also known in the art. Similarly, the oscillator circuit on the secondary side could be configured differently or not at all, which also known in the art. Likewise, the polarity of the diodes D1, D2 can be reversed, or the same could be replaced with other electrical circuit elements S1, S2.

To maintain the output voltage $U_A$ at a desired value in a no-load state, at least one capacitor C1, C2 is connected parallel relative to the electrical circuit elements S1, S2, here diodes D1, D2. The result is the additional effect, including all the described advantages as discussed above, that no separate connection is necessary between the first output line 10 and substrate 3 for the secondary wiring 15 for adjusting the no-load voltage.

A desired output voltage $U_A$ is to be maintained in the no-load state on the resonant converter 1. To this end, voltage pulses $U_E$ are applied for a specified time span $t_1$ on the primary side of the transformer T that excite the resonant circuit on the primary side. The excitation results in an oscillation on the secondary side of the transformer T. In the no-load state, the voltages that are applied to the capacitors C1, C2 also vibrate around the level of the output voltage $U_A$. The capacitors C1, C2 are thereby charged during the excitation on the primary side for the time span $t_1$, which also results in an increase of the no-load voltage at the output $U_A$. The excitation on the primary side is then interrupted for a second time span $t_2$. During this phase, the capacitors C1, C2 are discharged. To this end, it is possible to provide the discharge resistors R5, R6, as hinted at in FIG. 5. Without the discharge resistors R5, R6, the capacitors C1, C2 are discharged according to their self-discharge characteristics. If the secondary wiring 15 is implemented together with the measurement apparatus 14 for measuring the output voltage $U_A$ (see FIG. 7), the resistors R2, R3, R4 of the measurement apparatus 14 serve simultaneously as bleeder resistors. During the discharge action of the capacitors C1, C2, the no-load voltage $U_A$ decreases at the output. A medium output voltage $U_A$ at the output during open circuit operation is the result. This means by adjusting the voltage pulses $U_E$, pulse frequency and time spans $t_1$, $t_2$, it is possible to maintain the output voltage $U_A$ at a desired value. During normal operation (with a connected load at the output), this secondary wiring 15 is without influence. The voltage curves in the no-load state that result, for example, at a series-parallel resonant converter are depicted schematically in FIG. 6.

The two capacitors C1, C2 of the secondary wiring 15 therein can feature smaller dimensions than what has been the case with capacitor C3 in the usual circuit according to the prior art (see FIG. 3). This also allows for saving space on the substrate 3. Aside from this, it is now also possible to reduce the thermal load of the substrate 3, which also results in a possible size reduction of the substrate.

The smaller capacitance values C1, C2, however, also cause the output voltage $U_A$ to decrease more quickly in the no-load state, which is especially advantageous for applications in welding current sources, because it is thereby possible to reach the permitted maximum voltage after the end of the welding action more quickly.

Of course, the measurement apparatus 14 for measuring voltage and the secondary wiring 15 for controlling the output voltage $U_A$ in the no-load state can also be combined, as shown in FIG. 7, using a resonant converter 1 with center point rectifier. A combination of this kind is particularly advantageous because, this way, it is possible to regulate the output voltage $U_A$ also in the no-load state (no-load voltage) to have a desired value by measuring the voltage $U_P$ at the measurement point P that corresponds to the output voltage $U_A$, and/or it is possible to ensure a desired value of the no-load voltage.

The invention claimed is:

1. A circuit arrangement comprising:
   at least one transformer with center tap,
   wherein, on a secondary side of the at least one transformer having two outer connections and a center point, the center point of the secondary side of the transformer is connected via a first output line to a first output pole and each of the two outer connections are connected via respective electrical circuit elements and a second output line to a second output pole,
   a measurement apparatus for measuring an output voltage applied between the first output pole and the second output pole,
   wherein at least two series-connected resistors are connected between the two outer connections and a measurement point is formed between the two resistors, and
   a voltage measurement unit configured to measure a voltage between the measurement point and the second output pole, which corresponds to the output voltage.

2. The circuit arrangement according to claim 1, wherein the electrical circuit elements and the two resistors are disposed on at least one substrate.

3. The circuit arrangement according to claim 1, wherein the electrical circuit elements and the two resistors are disposed on a joint substrate.

4. The circuit arrangement according to claim 1, further comprising at least one further resistor, which is connected between the measurement point and the second output pole.

5. A resonant converter with a resonant circuit and a circuit arrangement according to claim 1.

6. The resonant converter according to claim 5, wherein at least one capacitor each is connected in parallel to each of the electrical circuit elements.

7. A method for determining an output voltage between a first output pole and a second output pole, wherein the first output pole is connected to a center point of a secondary side of a transformer and the second output pole is connected to two outer connections of the secondary side of the transformer via electrical circuit elements,
   measuring a voltage between a measurement point, formed between at least two series-connected resistors that are connected between the two outer connections, and the second output pole that corresponds to the output voltage.

8. The circuit arrangement according to claim 2, wherein the at least one substrate is a printed circuit board.

9. The circuit arrangement according to claim 3, wherein the joint substrate is a joint circuit board.

* * * * *